United States Patent [19]
Burton et al.

[11] Patent Number: 6,083,838
[45] Date of Patent: Jul. 4, 2000

[54] METHOD OF PLANARIZING A SURFACE ON A SEMICONDUCTOR WAFER

[75] Inventors: Randolph H. Burton, Windermere; Yaw S. Obeng, Orlando; Laurence D. Schultz, Kissimmee, all of Fla.

[73] Assignee: Lucent Technologies Inc., Murray Hill, N.J.

[21] Appl. No.: 09/082,162

[22] Filed: May 20, 1998

[51] Int. Cl.⁷ .................................................. H01L 21/304
[52] U.S. Cl. ......................... 438/691; 438/692; 438/693; 438/745; 438/747; 438/750; 438/754
[58] Field of Search ..................................... 438/693, 692, 438/690, 691, 745, 747, 750, 753, 754; 427/97

[56] References Cited

U.S. PATENT DOCUMENTS

| | | | |
|---|---|---|---|
| 5,415,798 | 5/1995 | Pease et al. ............................. | 252/142 |
| 5,527,423 | 6/1996 | Neville et al. ......................... | 156/636.1 |
| 5,607,718 | 3/1997 | Sasaki et al. ............................. | 427/97 |
| 5,614,444 | 3/1997 | Farkas et al. ........................... | 437/225 |

OTHER PUBLICATIONS

Solomons, Graham. Organic Chemistry 5 th ed. John Wiley & Son Inc. p. 1050–1051, 1992.

*Primary Examiner*—Benjamin L. Utech
*Assistant Examiner*—Binh X. Tran

[57] ABSTRACT

The present invention provides a method of planarizing a surface on a semiconductor wafer containing metal. In one embodiment, the method comprises selecting a slurry that contains conventional components of an abrasive and an oxidant. The oxidant is known to have a known rate of oxidation and is capable of oxidizing the metal. This embodiment further comprises reducing a rate of exposure of the metal to the oxidant by altering a property of the slurry, oxidizing the metal at the reduced rate to form an oxide of the metal, and removing the oxide with the abrasive to produce a planarized surface of the semiconductor wafer.

18 Claims, 2 Drawing Sheets though intuitively obvious from the following descriptions of different variations of the present invention given in the Summary of the Invention have necessarily been omitted. It will be appreciated that those of ordinary skill in the art may be able to design or modify other embodiments for carrying out the same purposes of the present invention.

METHOD OF PLANARIZING A SURFACE ON A SEMICONDUCTOR WAFER

TECHNICAL FIELD OF THE INVENTION

The present invention is directed, in general, to a method of planarizing a surface on a semiconductor wafer and, more specifically, to a method of altering a property of a slurry to control a rate of oxidation of the surface.

BACKGROUND OF THE INVENTION

It is well known that integrated circuit fabrication on semiconductor wafers requires the formation of precisely controlled apertures, such as contact openings or "vias," that are subsequently filled and interconnected to create components and very large scale integration (VLSI) or ultra large scale integration (ULSI) circuits. Equally well known is that the patterns defining such openings are typically created by optical lithographic processes that require precise alignment with prior levels to accurately contact the active devices located in those prior levels.

It is also well known that alignment of one pattern layer to previous layers is done with the assistance of special alignment patterns (i.e., alignment marks) designed onto each mask level. When these special patterns are aligned, it is accepted that the remainder of the circuit patterns are also correctly aligned. The adjustment of the image of the mask being exposed to the previously produced patterns was originally performed by human operators, who compared the image locations under a microscope and adjusted the position of the mask to bring it into alignment with the wafer patterns. Decreasing feature sizes and the increasing number of alignments per wafer, however, have promoted the development of automatic alignment systems for use with projection aligners.

One type of conventional automatic alignment procedure involves the use of alignment marks consisting of two rectangular patterns, which are parallel to the directions of the stage motion. In most instances, these alignment marks are formed in the kerf or "street" that separates the individual integrated circuits formed on the semiconductor wafer. Two corresponding rectangular patterns are located on the reticle, and their image is projected onto the wafer. The superimposed alignment target and the reticle image are reflected back into the main optical element of the aligner, and then into an on-axis microscope. The image from the microscope is focused onto the face of a TV camera and is subsequently digitized into a form that can be analyzed by a computer. When alignment is achieved, a signal is obtained.

Recently, manufacturers have encountered problems with alignment marks during the manufacturing process. During conventional metal chemical metal polishing (CMP) of metal stacks, an oxidant is used to convert the top metal to metal oxides. These metal oxides are subsequently abraded in-situ with some harder metal oxide abrasives. The oxidation of the top metal is invariably an exothermic process, which leads to enhanced process temperatures. These increases temperatures increase significantly when a large number of wafers is polished simultaneously (i.e., larger batch size).

During metal CMP, areas dense in features (i.e., alignment marks) tend to oxidize at a faster rate than areas with sparse distributions. This uncontrollable oxidation of the metals forming the alignment marks is commonly referred to as oxide erosion. Additionally, manufacturers have observed that oxide erosion in dense arrays increases dramatically as batch sizes are increased. In such instances, the alignment marks may be either completely destroyed or severely damaged by this erosion. Whether damaged or destroyed, the alignment marks are useless once altered by the erosion since they are no longer optically aligned parallel to the directions of the stage motion.

Accordingly, what is needed in the art is a method of controlling and minimizing the oxidation and resulting oxide erosion that occurs during a CMP process.

SUMMARY OF THE INVENTION

To address the above-discussed deficiencies of the prior art, the present invention provides a method of planarizing a surface on a semiconductor wafer containing metal. In one embodiment, the method comprises selecting a slurry that contains conventional components of an abrasive and an oxidant. The oxidant is known to have a known rate of oxidation and is capable of oxidizing the metal. This embodiment further comprises reducing a rate of exposure of the metal to the oxidant by altering a property of the slurry, oxidizing the metal at the reduced rate to form an oxide of the metal, and removing the oxide with the abrasive to produce a planarized surface of the semiconductor wafer.

Thus, in a broad scope, the present invention provides a method in which the rate of oxidation is reduced to inhibit oxide erosion that occurs during conventional chemical/mechanical polishing processes.

One embodiment provides a method where reducing a rate of exposure includes reducing a solubility of by-products in the slurry. Depending on the embodiment, the solubility may be reduced in various ways. For example, the solubility of by-products in the slurry may be reduced by reducing a temperature of the slurry. A by product of the oxidation process is, of course, heat, which appears to affect the mechanical properties of the metal oxide film by making it easier to be abraded. This enhanced rate results in recessed metal plugs that are separated by thin oxide walls that rapidly collapse with polishing, thereby leading to oxide erosion. It has been found that a reduction in temperature reduces the solubility, which correspondingly reduces the oxide erosion. Generally, the slurry is deposited on the platen at ambient conditions. However, in the present invention, the slurry is reduced by chilling it to a temperature from about 5° C. to about 25° C. In a more specific embodiment, however, the slurry is chilled to about 11° C.

The solubility of the slurry may also be reduced by adding an alcohol to the slurry. In specific embodiment, the alcohol may be a glycol, and in a more specific embodiment, the glycol may be propylene glycol or ethylene glycol.

The rate of exposure may also include changing the rate of oxidation or by adding a surfactant to the slurry wherein the slurry may be alkyl phenol ethoxylate, fatty alcohol ethoxylate, fatty amine ethoxylate, propylene oxide-ethylene oxide block copolymers, or ethylene diamine propoxylate ethoxylate. In certain embodiments, the addition of surfactant may form surfactant micelles that encapsulate the oxidant, which in turn, reduces the rate of oxidation. Alternatively, reducing a rate of exposure includes changing a viscosity of the slurry, which may also include adding a surfactant to the slurry.

In another embodiment, reducing a rate of exposure includes adding a corrosion inhibitor to the slurry wherein the inhibitor may be hydroxyl compounds, such as cathecol, phenol, glycol, or polyalcohol, or the inhibitor may be amine compounds or thiphenol.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
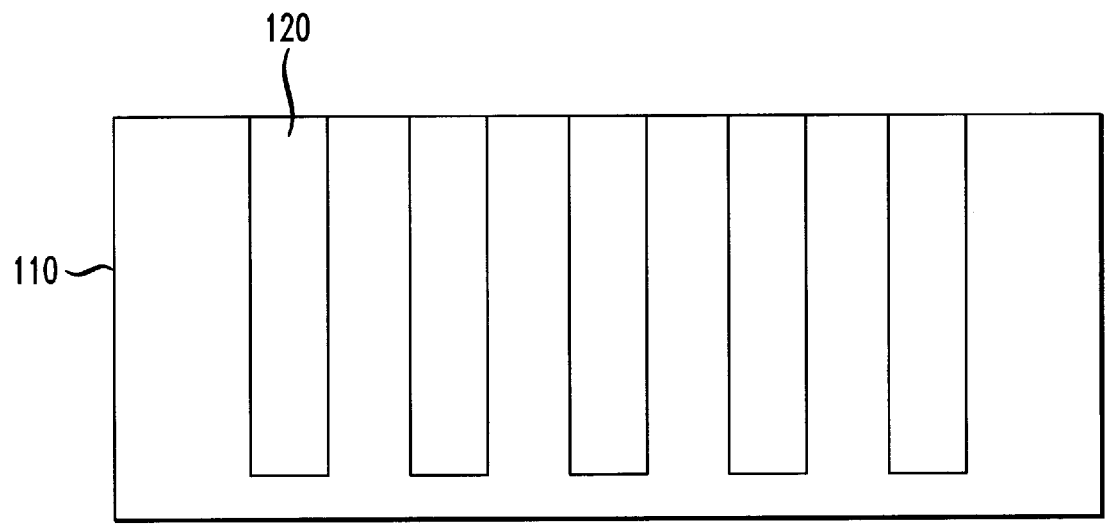
FIGS. 1A–1B illustrate a semiconductor wafer employing alignment marks and suffering the effects of oxide erosion.
Figure 1B:
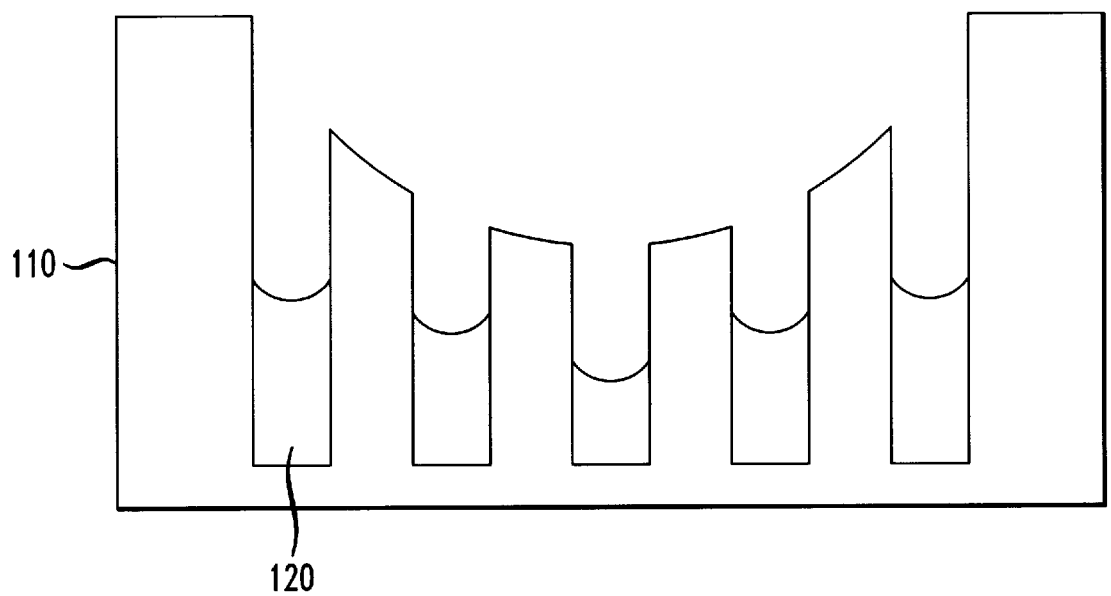

Referring initially to FIGS. 1A–1B, illustrated are semiconductor wafers employing alignment marks before and after oxide erosion. FIG. 1A shows a semiconductor wafer 110 that employs numerous design structures, such as contact plugs (one of which 16 designated 120) or alignment marks. The contact plugs 120 are conventionally formed from metal plugs, which are recessed in the semiconductor wafer 110. Typically, the semiconductor wafer may include metal, which may be tungsten, titanium, titanium nitride, copper, tantalum or tantalum nitride.

The semiconductor wafer 110, including the contact plugs 120, undergoes a conventional metal chemical metal polishing (CMP) process during fabrication. This process includes a metal CMP of the metal stacks within the semiconductor wafer 110. Commonly, the metal stacks include either a tungsten/titanium nitride/titanium combination or a copper/tantalum nitride/tantalum combination.

One portion of the CMP process includes using a slurry containing an oxidant to convert the top metal surface into metal oxides or hydroxides. The resulting metal derivatives are subsequently removed by abrading the surface of the wafer 110 with a harder metal oxide abrasive to produce a planarized surface.

Commonly, the combination of the oxidants, increased process temperatures (due to larger batch sizes) and dense contact plug features tend to cause uncontrollable oxidation of the wafer 110 and the contact plugs 120. This phenomenon is commonly referred to as oxide erosion. FIG. 1B shows the effects of oxide erosion on the semiconductor wafer 110 and the contact plugs 120 that result during the conventional CMP process. As seen, a severe dishing may occur in areas with high feature densities due to this uncontrollable oxidation. Additionally, the erosion chronically affects the contact plugs, either completely destroying them or, at a minimum, making them unusable.

To counter this phenomenon, a specific slurry, containing an abrasive and an oxidant with a known rate of oxidation, is first chosen for use in the CMP process. The slurry and its selection for a particular polishing processes are well known by those who are skilled in the art. In an advantageous embodiment, the oxidant used may be inorganic oxidants, such as tribypyridyl complexes of Fe(III), cerium (IV) salts. Other inorganic oxidants may include copper (II) salts, copper (II) salts mixed with KI, potassium iodidate, bromate salts, calcium salts, lead tetraacetate, ammonium and alkalimetal salts of peroxodisulfates, ferric nitrate, hydrogen peroxide and household bleach. In order to control the oxidation of the metal in the semiconductor wafer 110, the rate of exposure of the metal to the oxidant is reduced by altering a property of the slurry.

Once the slurry's property is altered, the metal is oxidized at a reduced controllable exposure rate. After oxidization, the resulting metal oxides are then removed by abrading the surface of the semiconductor wafer with a harder metal oxide abrasive to produce a planarized surface. Exemplary abrasives may be silicon dioxide ($SiO_2$), cerium trioxide ($Ce_2O_3$) or aluminum trioxide ($Al_2O_3$).

There are numerous ways to alter a property, e.g., chemical or physical, of the slurry in order to reduce the rate of exposure of the metal to the oxidant. For example, the solubility of the slurry can be reduced. As the slurry abrades the oxidized metal, it forms a by product, which becomes part of the slurry. The reduction in the solubility of the slurry in general causes the by product portion of the slurry to reside longer on the surface of the semiconductor wafer 110 and incidentally act to mask portions of the surface, thus reducing the rate of exposure of the metal to the oxidant. In essence, these by products stop the oxidation of portions of the surface until removed. The portions previously covered by the by products are then oxidized once the surface of the wafer is cleaned during the polishing processes. Because the solubility of the slurry is reduced, the by products tend to remain on the surface longer. Thus, the oxidation of the metal can be controlled by reducing the solubility of the slurry.

The solubility of by-products in the slurry may be changed by lowering the temperature of the slurry, thus changing its viscosity. In an advantageous embodiment, the temperature of the slurry may be lowered to a temperature ranging from about 25° C. to about 5° C. In a more specific embodiment however, the slurry may be chilled to about 11° C.

Another method for reducing the solubility of the slurry includes adding an alcohol to the slurry. In an advantageous embodiment, the alcohol is a glycol, while in yet another advantageous embodiment, the glycol may be propylene glycol or ethylene glycol. The alcohol may be present in a ratio of about 1 to 5 parts by volume of alcohol to 100 parts by volume of slurry.

Another way in which the rate of exposure of the metal to the oxidant can be reduced is by changing the rate of oxidation of the oxidant. This may be accomplished by altering the type of oxidant used in the process. Altering the oxidant may either be done by adding a substance to the slurry to change the chemical characteristics of the existing oxidant, or by completely substituting another oxidant for the original. In other embodiments, the oxidants may include, substituted oxidants, commonly referred to as marginal oxidants, such as include hydroxylamines in acidic media, benzoyl peroxide, nitrobenzene sulfonyl peroxides, benzoquinone and 8-hydroxy quinone. When employed, these substituted oxidants usually constitute approximately 2% weight volume of the slurry.

Yet another way in which the rate of exposure of the metal to the oxidant may be reduced is by adding a surfactant to the slurry. Once added, the viscosity of the slurry increases and surfactant micelles form in the slurry, encapsulating the oxidant. The surfactant encapsulates the oxidant, thus inhibiting the oxidants ability to oxidize the underlying metal. For a higher oxidation rate, less surfactant may be added to allow more free unencapsulated oxidant to react with the semiconductor wafer 110 and contact plugs 120. In a preferred embodiment, the surfactant may be alkyl phenol ethoxylate, fatty alcohol ethoxylate, fatty amine ethoxylate, propylene oxide-ethylene oxide block copolymers or ethylene diamine propoxylate ethoxylate. When employed, the surfactants are often present in an amount of about 0.25% to about 2% parts by volume of surfactant to about 100 parts by volume of slurry.

The rate of exposure of the metal to the oxidant may also be reduced by adding a corrosion inhibitor to the slurry. In an advantageous embodiment, the corrosion inhibitor may be a hydroxyl compound, amine compound or thiphenol or thiol compounds, such as thiophenol. In yet a further advantageous embodiment, the hydroxyl compound may be catechol, phenol, glycol or polyalcohol. When employed, the corrosion inhibitor usually constitutes less than about 2.5% parts by volume or inhibitor to 100 parts by volume of the slurry.

Figure 2:
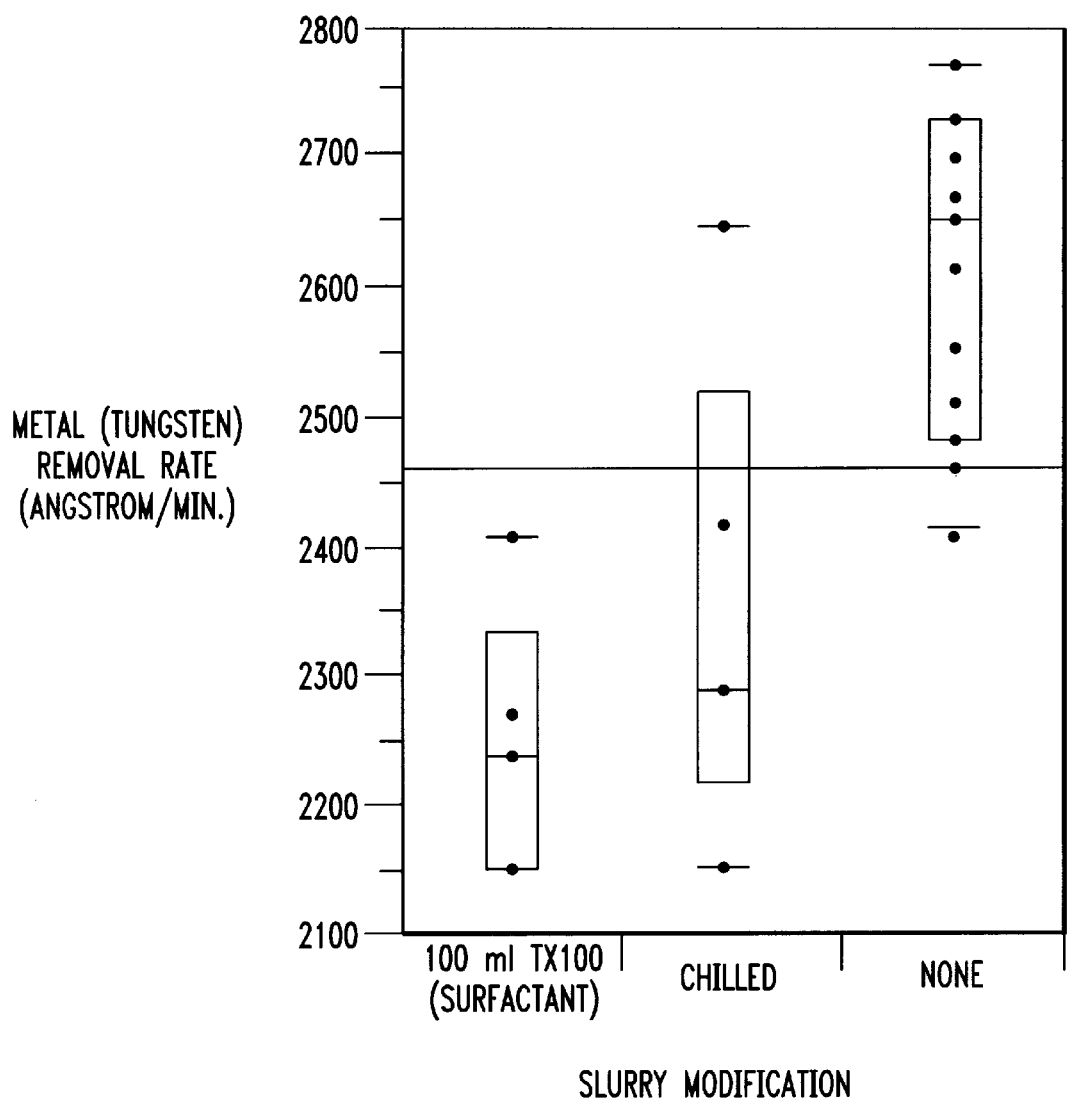
FIG. 2 illustrates a chart showing changes in metal (tungsten) removal rates resulting from various slurry modifications.

Turning now to FIG. 2, illustrated is a chart showing changes in metal (tungsten) removal rates resulting from various slurry modifications. With continuing reference to FIGS. 1A–1B this chart illustrates the advantages of employing various embodiments of the method to reduce and control the rate at which the oxidants in the slurry oxidize the surface of the semiconductor wafer 110. As shown, the addition of surfactants greatly reduces the metal (tungsten) removal rate from about 2500 nm–2750 nm per minute to about 2150 nm–2325 nm per minute. When no surfactant is added and the slurry is merely chilled, the effects are still dramatic, reducing the removal rate from about 2500 nm–2750 nm per minute to about 2225 nm–2525 nm per minute. Thus, the chart as illustrated in FIG. 2, clearly shows that by altering a physical or chemical property of the slurry, a dramatic rate in the rate of oxide erosion can be achieved.

From the foregoing, it is apparent that the present invention provides a method of planarizing a surface on a semiconductor wafer containing metal. On such method comprises selecting a slurry that contains conventional components of an abrasive and an oxidant. The oxidant is known to have a known rate of oxidation and is capable of oxidizing the metal. This embodiment further comprises reducing a rate of exposure of the metal to the oxidant by altering a property of the slurry, oxidizing the metal at the reduced rate to form an oxide of the metal, and removing the oxide with the abrasive to produce a planarized surface of the semiconductor wafer.

Although the present invention has been described in detail, those skilled in the art should understand that they can make various changes, substitutions and alterations herein without departing from the spirit and scope of the invention in its broadest form.

What is claimed is:

1. A method of planarizing a surface on a semiconductor wafer containing metal, comprising:
    selecting a slurry including an abrasive and an oxidant having a known rate of oxidation, said oxidant capable of oxidizing said metal;
    reducing a said rate of exposure of said metal to said oxidant by altering a property of said slurry, wherein reducing a rate of exposure includes adding a surfactant to said slurry said surfactant selected from the group consisting of an alkyl phenol ethoxylate, fatty alcohol ethoxylate, a fatty amine ethoxylate, propylene oxide-ethylene oxide block copolymers, and ethylene diamine propoxylate ethoxylate;
    oxidizing said metal at said reduced rate to form and oxidation product of said metal; and
    removing said oxidation product with said abrasive to produce a planarized surface of said semiconductor wafer.

2. The method of claim 1 wherein reducing a rate of exposure includes changing said rate of oxidation.

3. The method of claim 1 wherein said surfactant forms surfactant micelles that encapsulate said oxidant.

4. The method of claim 1 wherein selecting a slurry includes selecting a slurry having an abrasive selected from the group consisting of:
    silicon dioxide ($SiO_2$),
    cerium trioxide ($Ce_2O_3$), and
    aluminum trioxide ($Al_2O_3$).

5. The method of claim 1 wherein said metal is selected from the group consisting of:
    tungsten,
    titanium,
    titanium nitride,
    copper,
    tantalum nitride, and
    tantalum.

6. The method of claim 1 wherein removing said oxidized metal includes abrading said oxidized metal with said abrasive.

7. The method of claim 1 wherein reducing a rate of exposure includes changing a viscosity of said slurry.

8. The method of claim 7 wherein changing a viscosity of said slurry includes adding a surfactant to said slurry.

9. The method of claim 1 wherein reducing a rate of exposure includes adding a corrosion inhibitor to said slurry, said corrosion inhibitor operable in an acidic media.

10. The method of claim 9 wherein adding a corrosion inhibitor includes adding an inhibitor selected from the group consisting of:
    hydroxyl compounds,
    amine compounds, and
    thiophenol.

11. The method of claim 10 wherein said hydroxyl compounds are selected from the group consisting of:
    catechol,
    phenol,
    glycol, and
    a polyalcohol.

12. The method of claim 1 wherein reducing the rate of exposure includes reducing a solubility of a by-product in said slurry.

13. The method of claim 2 wherein reducing a solubility includes reducing the temperature of said slurry.

14. The method of claim 13 wherein reducing a temperature includes chilling said slurry to a temperature of about 11° C.

15. The method of claim 12 wherein reducing a solubility includes adding an alcohol to said slurry.

16. The method of claim 15 wherein said alcohol is a glycol.

17. The method of claim 16 wherein said glycol is selected from the group consisting of:
    propylene glycol and
    ethylene glycol.

18. A method of of planarizing a surface on a semiconductor wafer containing a metal. comprising:
    selecting a slurry including an abrasive and an oxidant having a know rate of oxidation, said oxidant capable of oxidizing said metal and selected from the group consisting of trisbypyridyl complexes of Fe(III) or cerium (IV) salts;

reducing a said rate of exposure of said metal to said oxidant by altering a property of said slurry;

oxidizing said metal at said reduced rate to form and oxidation product of said metal; and removing said oxidation product with said abrasive to produce a planarized surface of said semiconductor wafer.

* * * * *